(12) United States Patent
Festag et al.

(10) Patent No.: US 7,354,311 B2
(45) Date of Patent: Apr. 8, 2008

(54) HOUSING-SHAPED SHIELDING PLATE FOR THE SHIELDING OF AN ELECTRICAL COMPONENT

(75) Inventors: Mario Festag, Berlin (DE); Uwe Fischer, Berlin (DE)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/791,539

(22) Filed: Mar. 1, 2004

(65) Prior Publication Data

US 2004/0166734 A1    Aug. 26, 2004

Related U.S. Application Data

(62) Division of application No. 10/047,800, filed on Jan. 15, 2002, now abandoned.

(30) Foreign Application Priority Data

Jan. 15, 2001   (DE) ................. 101 02 456

(51) Int. Cl.
  *H01R 13/648* (2006.01)
(52) U.S. Cl. .................................. 439/607
(58) Field of Classification Search ........... 439/607, 439/916; 343/767, 770, 771, 77; 385/2, 385/3; 174/35 R, 102 SP
  See application file for complete search history.

(56) References Cited

U.S. PATENT DOCUMENTS

| | | | |
|---|---|---|---|
| 3,340,534 A * | 9/1967 | Fee ............................. 343/738 |
| 3,530,479 A * | 9/1970 | Waldron ..................... 343/771 |
| 3,696,433 A * | 10/1972 | Killion et al. .............. 343/770 |
| 3,729,740 A * | 4/1973 | Nakahara et al. ........... 343/713 |
| 4,247,858 A * | 1/1981 | Eichweber ................... 343/729 |
| 4,328,502 A * | 5/1982 | Scharp ........................ 343/771 |
| 4,519,664 A | 5/1985 | Tillotson |
| 5,087,921 A * | 2/1992 | Kurtz .......................... 343/771 |
| 5,499,935 A | 3/1996 | Powell |
| 5,650,793 A * | 7/1997 | Park ........................... 343/771 |
| 5,726,666 A * | 3/1998 | Hoover et al. ............... 343/770 |
| 5,748,152 A * | 5/1998 | Glabe et al. ................ 343/770 |
| 5,822,195 A | 10/1998 | Brench et al. |
| 5,914,693 A * | 6/1999 | Takei et al. ................. 343/767 |
| 5,914,694 A * | 6/1999 | Raab ........................... 343/771 |
| 6,047,172 A | 4/2000 | Babineau et al. |
| 6,066,001 A | 5/2000 | Liptak et al. |
| 6,081,241 A * | 6/2000 | Josefsson et al. ........... 373/771 |
| 6,095,862 A | 8/2000 | Doye et al. |
| 6,147,299 A | 11/2000 | Ferguson |
| 6,178,096 B1 | 1/2001 | Flickinger et al. |
| 6,335,869 B1 | 1/2002 | Branch et al. |
| 6,344,978 B1 * | 2/2002 | Komiya ....................... 361/816 |
| 6,364,709 B1 | 4/2002 | Jones |
| 6,443,768 B1 | 9/2002 | Dirkers et al. |
| 6,459,517 B1 | 10/2002 | Duncan et al. |
| 6,524,134 B2 | 2/2003 | Flickinger et al. |
| 6,639,560 B1 * | 10/2003 | Kadambi et al. .... 343/700 MS |

* cited by examiner

*Primary Examiner*—Briggitte R. Hammond
(74) *Attorney, Agent, or Firm*—Workman Nydegger

(57) ABSTRACT

A housing-shaped shielding plate for shielding of an electrical component, in particular a radio-frequency, optoelectronic transceiver, is described. The housing-shaped shielding plate has a shielding plate body with a first region which lies inside a metallic structure, and with a second region which can be inserted through a cutout of the metallic structure and has an opening for coupling a connector. Accordingly, in the first region of the shielding plate body there are elongated slots, through which electromagnetic waves produced within the shielding plate body are specifically coupled out of the shielding plate.

9 Claims, 2 Drawing Sheets

FIG. 3
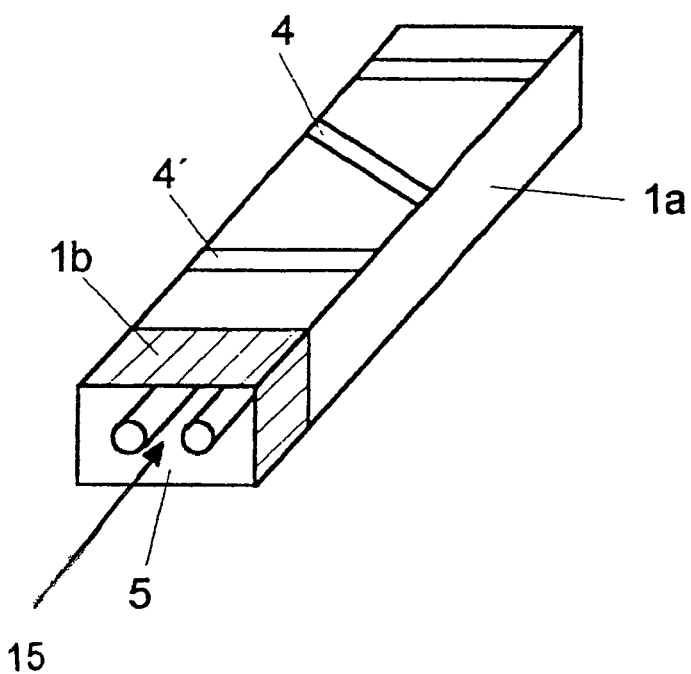
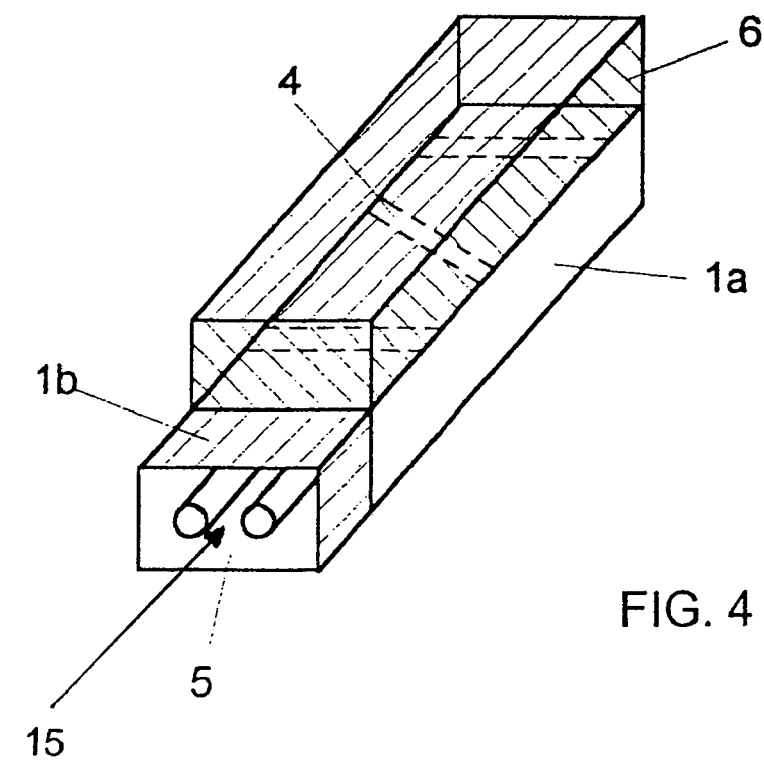
FIG. 4

HOUSING-SHAPED SHIELDING PLATE FOR THE SHIELDING OF AN ELECTRICAL COMPONENT

CROSS REFERENCE TO RELATED APPLICATION:

This is a division of U.S. application Ser. No. 10/047,800, filed Jan. 15, 2002, now abandoned.

BACKGROUND OF THE INVENTION

Field of the Invention

The invention relates to a housing-shaped shielding plate for the shielding of an electrical component. The shielding plate has a first region that can be disposed inside a metallic structure and a second region that can be inserted through a hole of the metallic structure.

It is known to provide an optoelectronic transceiver with a shielding plate for electromagnetic shielding. Shielding plates of this type are often formed as housings that are fastened on a printed-circuit board and accommodate the transceiver in them. For the connection of a transceiver disposed in this way to an optical network, one end of the shielding plate or end of the housing is inserted through a rear wall of a metallic structure. Infra-red light is coupled into the transceiver or out of it via an optical plug-in connector, which is inserted in the region of the housing part protruding out of the rear wall into a connector receptacle of the transceiver or an adapter coupled to the transceiver.

At data transmission rates in the range of Gbits/s, unwanted spurious emissions occur, escaping in particular in the region of the connector, which generally represents the only discontinuity of the housing or shielding plate. Consequently, at these frequencies the components come into the range of the prevailing wavelengths in their mechanical dimensions. Since the shielding plates guide the waves, instead of averting them, in the frequency range mentioned, difficult-to-control spurious emissions occur in the region of the connector.

To avoid this problem, it is known to seal the shielding plate as much as possible. This takes place with to some extent complex mechanical structures, which in each case attempt to enclose the spurious radiation. At very high data rates between 2.5 and 10 Gbits/s, however, resonance effects of the shielding plate can occur (cavity resonances), making the shield lose its shielding effect. A further disadvantage of known solutions is that enclosing radio-frequency electromagnetic energy sometimes causes instances of strong line-bound coupling into the vicinity of the shield to take place. This leads to increasingly difficult-to-control spurious radiation problems.

SUMMARY OF THE INVENTION

It is accordingly an object of the invention to provide a housing-shaped shielding plate for the shielding of an electrical component which overcomes the above-mentioned disadvantages of the prior art devices of this general type, which reduces spurious emissions as much as possible in the region of the connector of the component.

With the foregoing and other objects in view there is provided, in accordance with the invention, a housing-shaped shielding plate for shielding an electrical component, including a radio-frequency, optoelectronic transceiver. The housing-shaped shielding plate containing a shielding plate body having a first region to be disposed inside a metallic structure, and a second region to be inserted through a cutout of the metallic structure. The first region of the shielding plate body has elongated openings formed therein through which electromagnetic waves produced within the shielding plate body are coupled out of the shielding plate body.

It is accordingly envisaged by the invention to provide on the shielding plate, in a region of the shielding plate that lies inside a metallic structure, elongated cutouts through which the electromagnetic waves are specifically coupled out of the shielding plate. The invention is based on the idea of effectively emitting or coupling out radio-frequency energy through the cutouts in the shielding plate, at least for certain frequencies.

The metallic structure is, for example, a housing or the front or rear wall of a relatively large piece of electrical equipment.

The intentional coupling out of spurious radiation in the interior of the metallic structure has the effect that the spurious emissions are corresponding reduced in the region of the connector, which lies outside the metallic structure. The emission of electromagnetic waves into the space outside the shielding plate is reduced. Consequently, an emission is deliberately induced in a region of the shielding plate in which the spurious radiation cannot escape to the outside and consequently cannot be disruptive. The disruptive emission into the space outside is correspondingly reduced.

In a preferred configuration of the invention, the clearances are elongated slots or slot structures. The length of the slots is preferably $\lambda/2$ of the emitted interfering frequency, the slot acting as an antenna for the wavelength $\lambda$, in a way analogous to a dipole. In comparison with a dipole, the electric field strength and the magnetic field strength are reversed here, since the slot itself of course does not carry current.

The slots preferably run in the longitudinal direction of the shielding plate. It is nevertheless likewise possible for them to be formed transversely or at an angle in relation to the longitudinal direction of the shielding plate. In the latter case, it is provided in particular that they are formed as transverse radiators, which run substantially transversely in relation to a longitudinal side of the shielding plate. Furthermore, it may be envisaged to form in the shielding plate a plurality of slots of different lengths, through which different wavelengths are coupled out to a greater degree. In addition, the slots run from side to side on the shielding plate.

So as not to put at risk the signal integrity in the interior of the metallic structure, in a preferred development a suitable absorber material, which absorbs electromagnetic waves of the emitted frequency, is applied to the slot structures according to the invention.

In accordance with an added feature of the invention, the shielding plate body forms a housing for receiving an electrical component.

Other features which are considered as characteristic for the invention are set forth in the appended claims.

Although the invention is illustrated and described herein as embodied in a housing-shaped shielding plate for the shielding of an electrical component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a perspective view of a second exemplary embodiment of the shielding plate according to the invention; and FIG. 4 is a perspective view of a third exemplary embodiment of the shielding plate according to the invention.

DESCRIPTION OF THE PREFERRED EMBODIMENTS

Figure 1:
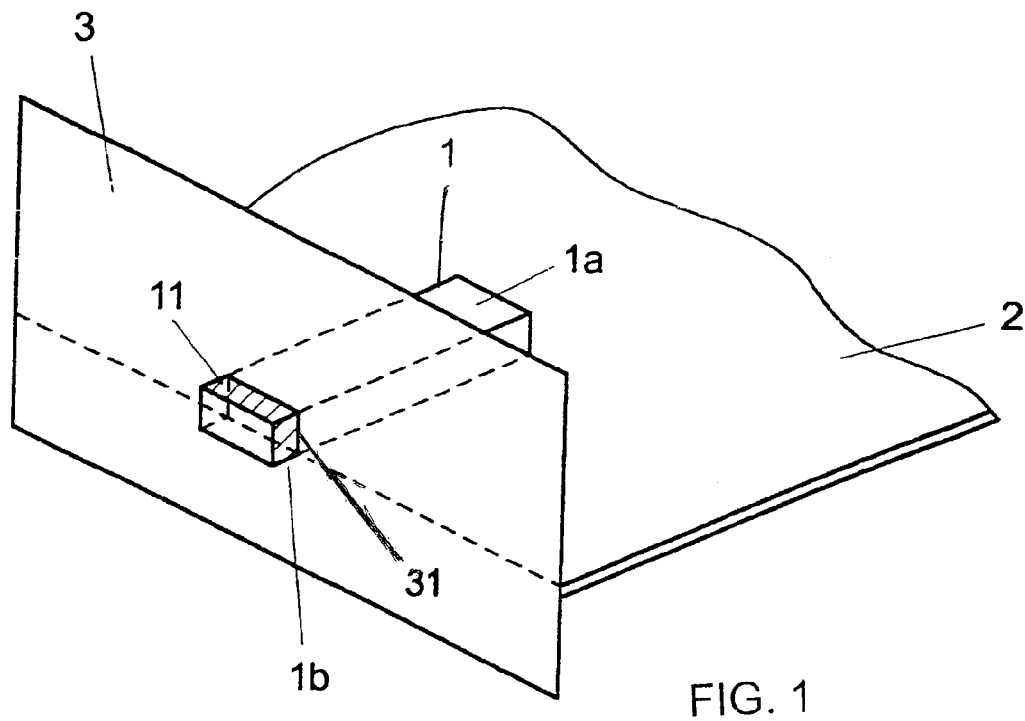
FIG. 1 is a diagrammatic, perspective view of a configuration of a shielding plate in a metallic structure according to the invention.

Referring now to the figures of the drawing in detail and first, particularly, to FIG. 1 thereof, there is shown schematically a configuration of a shielding plate 1 according to the invention with respect to a metallic structure 3, which partially surrounds the shielding plate 1. The metallic structure 3 is, in particular, a metallic housing or a front or rear wall of a relatively large piece of electrical equipment.

The shielding plate 1 is formed as a housing, which serves in particular for receiving an optoelectronic transceiver 15. The housing-shaped shielding plate 1 is fastened on a printed-circuit board 2, which represents for example a main board of a computer.

The shielding plate 1 has a rear region 1a, which is disposed inside the metallic structure 3, for example the sheet-metal housing of a computer. All that is shown of the metallic structure is the housing rear wall 3, in which an opening 31 is formed. The shielding plate 1 also has a front region 1b, which is inserted through the opening 31 of the rear wall 3 and accordingly protrudes out of the metallic structure 3.

The transceiver mounted in the shielding plate 1 functioning as a housing or inserted into it forms in the front region 1b a connector receptacle or an optical port 5, which serves for the coupling of an optical connector onto the transceiver. In the region of the optical port 5, there is an increased risk of a spurious emission of electromagnetic waves into the surroundings, since the port region represents a discontinuity of the shielding plate 1.

For electrical bonding of the shielding plate 1 to the housing rear wall 3, schematically represented contact springs 11, which are in electrical contact with the housing rear wall 3, are formed in the region where the shielding plate 1 passes through the opening 31.

Figure 2:
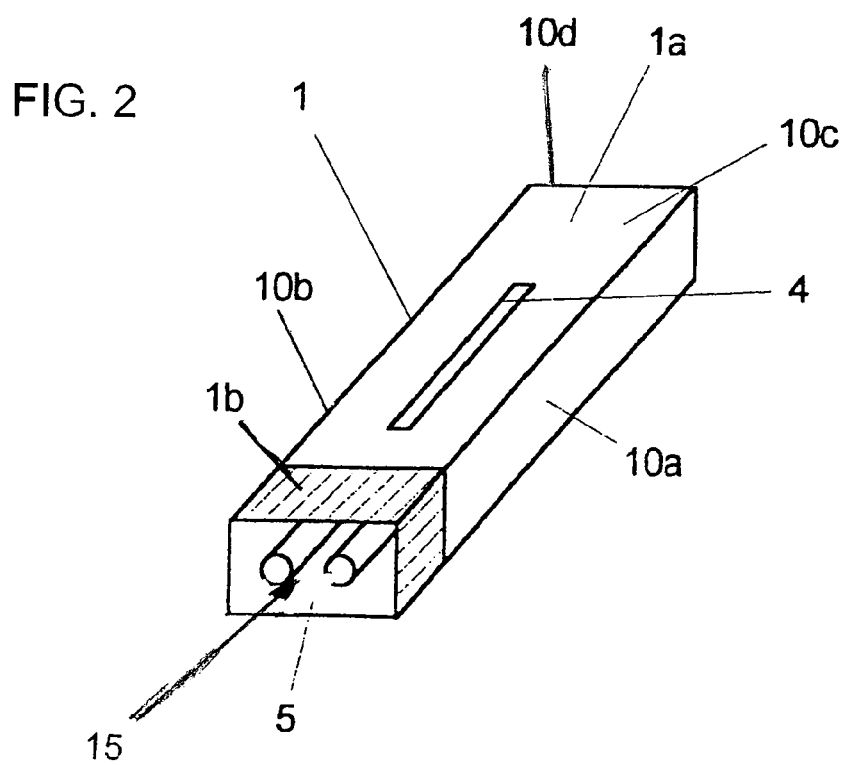
FIG. 2 is a perspective view of a first exemplary embodiment of the shielding plate according to the invention.

FIG. 2 shows the shielding plate 1 according to the invention. It has a closed, or at least partly closed, structure with side walls 10a, 10b, an upper wall 10c and a rear wall 10d.

It is possible to dispense at least partly with a base plate, provided that the shielding plate 1 is mounted directly on the printed-circuit board 2. A longitudinal slot 4 is formed in the shielding plate 1 on the upper wall 10c at its rear region 1a, lying inside the metallic structure 3.

The longitudinal slot 4 represents a slot antenna 4 for those electromagnetic waves of which the wavelength is twice the length of the slot 4. Accordingly, a slot length is chosen such that it is equal to $\lambda/2$ of the frequencies most likely to be disruptive. At the same time, it is possible to form longitudinal slots 4 of different lengths on the shielding plate 1, so that emission takes place over a certain frequency range. The longitudinal slot 4 preferably has a length of between 3.75 mm ($\lambda/2$ for 40 GHz) and 15 cm ($\lambda/2$ for 1 GHz).

The slots 4 can be formed as simple punched apertures in the shielding plate 1 and can accordingly be produced easily and at low cost. They can similarly be formed on the other sides 10a, 10b or 10d of the shielding plate 1.

In the front region 1b of the shielding plate 1 there is formed a schematically indicated connector receptacle or optical port 5 of the transceiver disposed in the shielding plate 1. The region 1b in this case protrudes through the cutout 31 of the metallic housing rear wall 3, as represented in FIG. 1.

An alternative configuration of the invention is represented in FIG. 3. Here, slot structures 4' which run transversely or at an angle in relation to a longitudinal axis of the shielding plate 1, and preferably run in each case from longitudinal edge to longitudinal edge of the respective side of the shielding plate 1, are formed in the rear region 1a of the shielding plate 1.

In a development of the invention according to FIG. 4, an absorber material 6 has been placed onto the slot structures 4' in order to absorb the emitted electromagnetic radiation as much as possible. This may be, for example, an absorber material such as that obtainable under the designation "C-RAM KRS" "C-RAM KFE" from Cuming Microwave, Aron, Mass. 02322, USA.

Similarly, it may also be envisaged to form a corresponding absorber material 6 on the slot structures 4 shown in FIG. 1. The provision of the absorber material 6 reduces the coupling out of spurious radiation into the interior of the metallic structure 3 (of the computer housing), so that the risk of the signal integrity in the interior of the metallic structure 3 being put at risk is reduced. However, it has been found that this risk is in any case very low.

The formation according to the invention of slot structures 4, 4' in the rear region of the shielding plate 1 causes increased emission of spurious radiation into the interior of the metallic structure 3. As a result, the spurious radiation emerging from the connector region 5 and emitted into the surroundings is reduced.

The invention is not restricted in its implementation to the exemplary embodiments represented above. All that is important for the invention is that in part of a housing-shaped shielding plate 1 which is located inside a metallic structure 3 there are formed the slot structures 4, 4' through which electromagnetic spurious radiation is specifically coupled out of the shielding plate 1 and into the closed metallic structure 3.

We claim:

1. A housing-shaped shielding plate assembly, comprising:

an optoelectronic component; and a shielding plate body for shielding said electrical component, said shielding plate body having:

a first region disposed inside a metallic structure, said first region having a plurality of wall sections including a rear wall, a first side wall, a second side wall, and an upper side wall that connects at longitudinal edges of the first side wall and the second side wall, wherein the rear wall connects with the first side wall, the second side wall and the upper side wall and at least partially closes the first region of the shielding plate body inside the metallic structure; and a second region inserted through a cutout of the metallic structure, wherein said second region includes a discontinuity through which an emission of electromagnetic waves produced within said shielding plate body occurs;

wherein at least one of said plurality of wall sections of said first region of said shielding plate body includes a plurality of elongated openings formed therein, the plurality of elongated openings being slot antennas through which electromagnetic waves produced within said shielding plate body are coupled out of said shielding plate body such that the emission of the electromagnetic waves through the discontinuity is reduced and wherein the electromagnetic waves coupled out through the slot antennas are contained by the metallic structure.

2. The shielding plate according to claim 1, wherein each slot antenna has a different length and at least one slot antenna has a length of $\lambda/2$ of the electromagnetic waves emitted.

3. The shielding plate according to claim 1, wherein at least one of slot antenna runs in a longitudinal direction of said shielding plate body.

4. The shielding plate according to claim 1, wherein at least one slot antenna runs one of transversely and at an angle in relation to a longitudinal direction of said shielding plate body.

5. The shielding plate according to claim 1, wherein said plurality of wall sections includes side wall sections and at least one slot antenna extends between opposite longitudinal edges the first and second side wall sections such that the at least one slot antenna begins at the longitudinal edge of the first side wall and ends at the longitudinal edge of the second side wall.

6. The shielding plate according to claim 1, including an absorber material for absorbing electromagnetic waves and applied over said elongate openings formed in said shielding plate body.

7. The shielding plate according to claim 1, wherein said shielding plate body forms a housing for receiving said optoelectronic component.

8. The shielding plate according to claim 1, wherein said shielding plate body emits electromagnetic waves being coupled out of said shielding plate body and radiated into the interior of the metal structure.

9. The shielding plate according to claim 1, wherein said optoelectronic component includes an optoelectronic transceiver and said second region has a connector receptacle to enable coupling of an optical connector to the optoelectronic transceiver.

* * * * *